United States Patent
Terazono et al.

(10) Patent No.: US 10,355,487 B2
(45) Date of Patent: Jul. 16, 2019

(54) PHOTOVOLTAIC SYSTEM

(71) Applicant: Toshiba Mitsubishi-Electric Industrial Systems Corporation, Chuo-ku (JP)

(72) Inventors: Takahiro Terazono, Tokyo (JP); Naoki Fujiwara, Tokyo (JP); Yoshio Tsuji, Tokyo (JP); Shuji Tanaka, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 503 days.

(21) Appl. No.: 15/053,048

(22) Filed: Feb. 25, 2016

(65) Prior Publication Data

US 2016/0172864 A1 Jun. 16, 2016

Related U.S. Application Data

(63) Continuation of application No. PCT/JP2013/072883, filed on Aug. 27, 2013.

(51) Int. Cl.
*H02J 3/32* (2006.01)
*H02J 3/38* (2006.01)
(Continued)

(52) U.S. Cl.
CPC ........ *H02J 3/383* (2013.01); *H01L 31/02021* (2013.01); *H02J 3/32* (2013.01);
(Continued)

(58) Field of Classification Search
CPC ......... H02J 3/32; H02J 7/35; H01L 31/02021; H02S 40/32; H02M 7/44; Y02E 70/30; Y02E 10/563
See application file for complete search history.

(56) References Cited

U.S. PATENT DOCUMENTS

| | | | |
|---|---|---|---|
| 2007/0252716 A1* | 11/2007 | Burger | H02M 7/493 340/635 |
| 2009/0283129 A1* | 11/2009 | Foss | H02M 7/493 136/244 |
| 2010/0164459 A1* | 7/2010 | Perichon | H02H 3/08 323/284 |

FOREIGN PATENT DOCUMENTS

| | | |
|---|---|---|
| JP | 2001-5543 | 1/2001 |
| JP | 2002-199589 | 7/2002 |

(Continued)

OTHER PUBLICATIONS

Office Action dated Mar. 7, 2017 in Japanese Patent Application No. 2015-533825 (with English translation).

(Continued)

*Primary Examiner* — Jared Fureman
*Assistant Examiner* — Duc M Pham
(74) *Attorney, Agent, or Firm* — Oblon, McClelland, Maier & Neustadt, L.L.P.

(57) ABSTRACT

A photovoltaic system includes power generators configured to generate power utilizing sunlight, inverters configured to convert the power generated by the power generators into alternating-current power output to a power system, a first limiter configured to limit output power of the inverters not more than a predetermined capacity, a second limiter configured to limit output power of at least one of the inverters to a level exceeding the predetermined capacity limited by the first limiter, when a predetermined condition is satisfied, and an inverter controller configured to control the output power of the inverters, based on the first limiter or the second limiter.

13 Claims, 11 Drawing Sheets

(51) Int. Cl.
*H02J 7/35* (2006.01)
*H02M 7/44* (2006.01)
*H01L 31/02* (2006.01)
*H02S 40/32* (2014.01)
*H02S 40/38* (2014.01)

(52) U.S. Cl.
CPC ............... *H02J 3/385* (2013.01); *H02J 7/35* (2013.01); *H02M 7/44* (2013.01); *H02S 40/32* (2014.12); *H02S 40/38* (2014.12); *Y02E 10/563* (2013.01); *Y02E 10/566* (2013.01); *Y02E 10/58* (2013.01); *Y02E 70/30* (2013.01)

(56) References Cited

FOREIGN PATENT DOCUMENTS

| JP | 2002-199589 A1 * | 7/2002 | ............... G05F 1/67 |
|---|---|---|---|
| JP | 2008-141808 | 6/2008 | |
| JP | 2008-141808 A1 * | 6/2008 | ............ H02M 7/497 |
| JP | 2013-146171 | 7/2013 | |
| JP | 2013-162623 | 8/2013 | |
| JP | 2013-162623 A1 * | 8/2013 | ................ H02J 3/32 |

OTHER PUBLICATIONS

International Search Report dated Nov. 26, 2013 in PCT/JP2013/072883, filed Aug. 27, 2013 (with English Translation).
Written Opinion dated Nov. 26, 2013 in PCT/JP2013/072883, filed Aug. 27, 2013.
Yoshio Tsuji "Mega Solar-yo Seigyo System 'Main Site Controller'", Gijutsu Sogoshi OHM, vol. 99, No. 10, Oct. 12, 2012, 3 pages.
Combined Office Action and Search Report dated Jul. 24, 2017 in Chinese Patent Application No. 201380079196.1 (with unedited computer generated English translation of the Office Action and English language translation of the categories of cited documents).
Indian Office Action dated Feb. 19, 2019 in Indian Patent Application No. 201617009417.

* cited by examiner

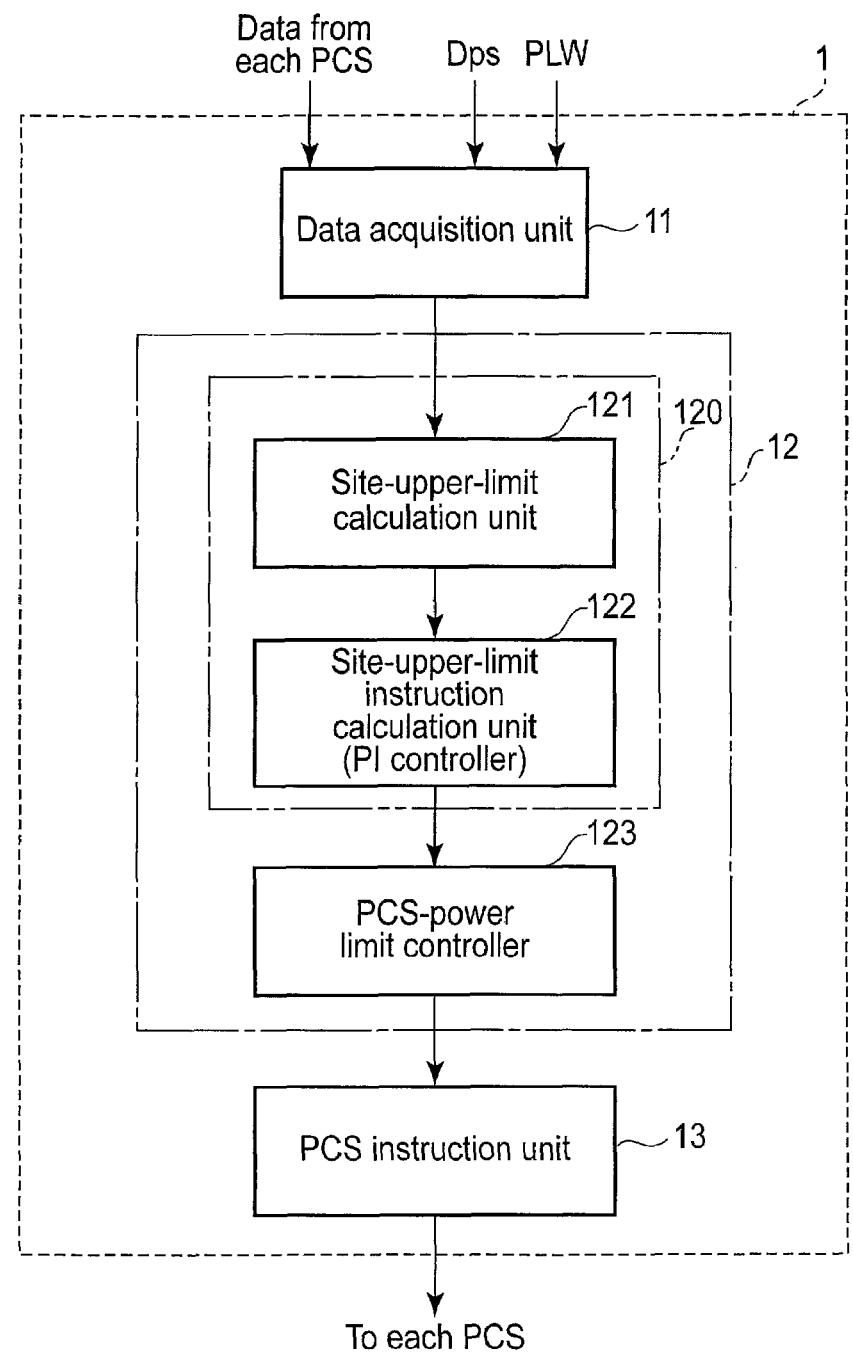
F I G. 2

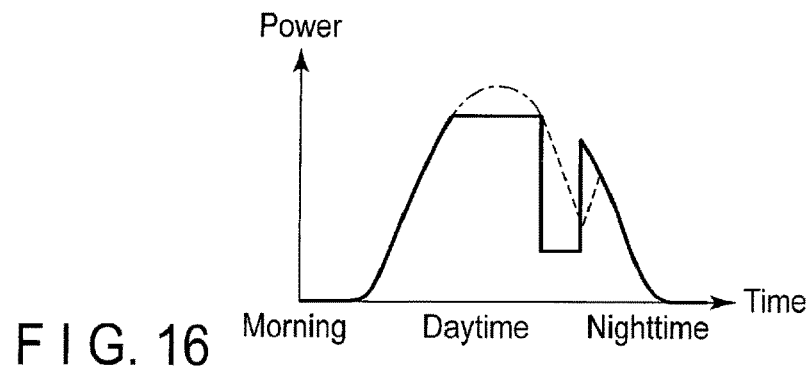
F I G. 16
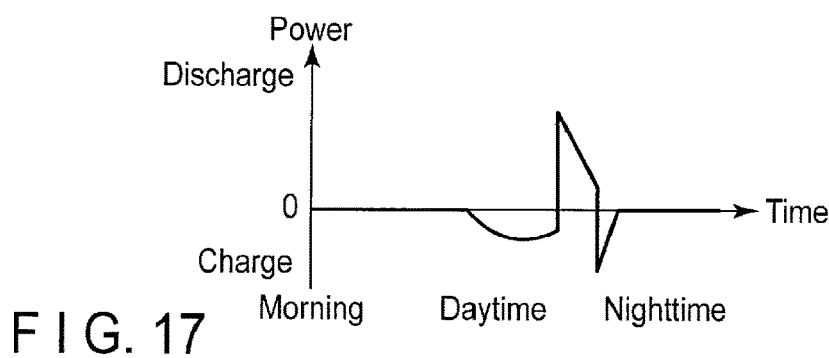
F I G. 17
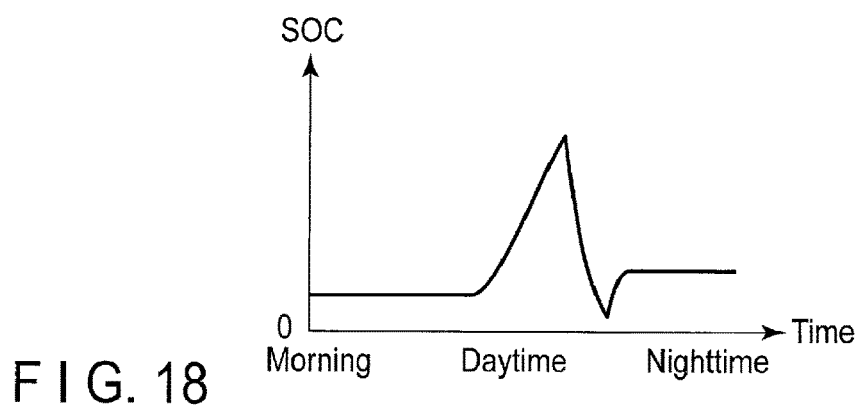
F I G. 18

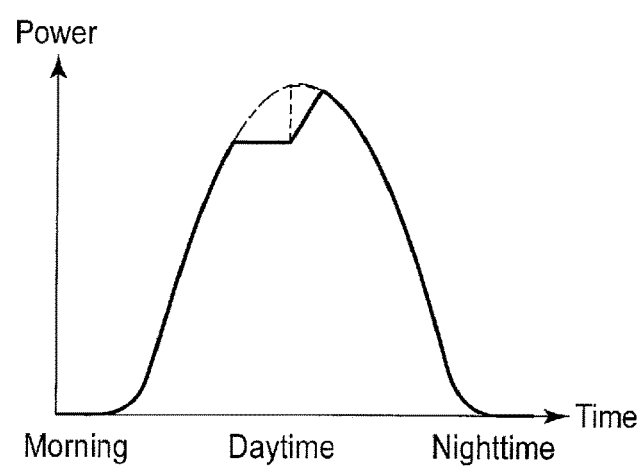
F I G. 19

PHOTOVOLTAIC SYSTEM

CROSS REFERENCE TO RELATED APPLICATIONS

This application is a Continuation application of PCT Application No. PCT/JP2013/072883, filed Aug. 27, 2013, the entire contents of which are incorporated herein by reference.

BACKGROUND OF THE INVENTION

1. Field of the Invention

The present invention relates to a photovoltaic system.

2. Description of the Related Art

In general, in a photovoltaic (PV) system, a PV module of a capacity larger than the rated capacity of a power conditioner (PCS, power conditioning system) is installed. When the electricity of the PV module exceeds the rated capacity of the PCS, the PCS limits its output below the rated capacity.

In order to control a PV system, called a mega solar power plant, which has a large capacity of several to several tens of megawatts, a main site controller (MSC) may be employed. The MSC performs power generation control of the mega-solar power plant, as well as centralized monitoring of a plurality of PCSs in the mega solar power plant.

For instance, the MSC performs the following power limit control: When the output of part of the PCSs decreases, for example, in the cloud cover, the MSC increases the output of other part of the PCSs that have a margin in output. Thus, the MSC performs control so that the power generated by the mega solar power plant will always be maximum at an active power limit (see Non-patent Document 1).

However, since each PCS limits electricity generated by a corresponding PV module not higher than the rated capacity, it cannot fully utilize the power generation capacity of the PV system, even if the MSC performs the above-mentioned power limit control.

PRIOR ART DOCUMENT

Non-Patent Document

[Non-patent Document 1] Yoshio TSUJI, "Mega Solar-yo Seigyo System 'Main Site Controller'", Gijutsu Sogoshi OHM, Ohmsha, Ltd., 12 Oct. 2012, vol. 99, no. 10 (no. 1240), pages 52 to 53

BRIEF SUMMARY OF THE INVENTION

It is an object of the present invention to provide a photovoltaic system that can fully utilize its electricity generation capacity.

In accordance with an aspect of the present invention, there is provided a photovoltaic system. the photovoltaic system comprises power generators configured to generate power utilizing sunlight; inverters configured to convert the power generated by the power generators into alternating-current power output to a power system; a first limiter configured to limit output power of the inverters not more than a predetermined capacity; a second limiter configured to limit output power of at least one of the inverters to a level exceeding the predetermined capacity limited by the first limiter, when a predetermined condition is satisfied; and an inverter controller configured to control the output power of the inverters, based on the first limiter or the second limiter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a block diagram showing the configuration of an MSC according to the first embodiment.

FIG. 16 is a graph showing one-day fluctuation in site output power due to control of the rechargeable battery by the rechargeable-battery controller according to the second embodiment.

FIG. 17 is a graph showing fluctuation in the charge and discharge of the rechargeable battery by the control of the rechargeable-battery controller according to the second embodiment.

FIG. 18 is a graph showing fluctuation in the storage amount of the rechargeable battery by the control of the rechargeable-battery controller according to the second embodiment.

FIG. 19 is a graph showing another-day fluctuation in site output power because of the control of the rechargeable battery by the rechargeable-battery controller according to the second embodiment.

DETAILED DESCRIPTION OF THE INVENTION

With reference to the accompanying drawings, embodiments of the invention will be described.

First Embodiment

Figure 1:
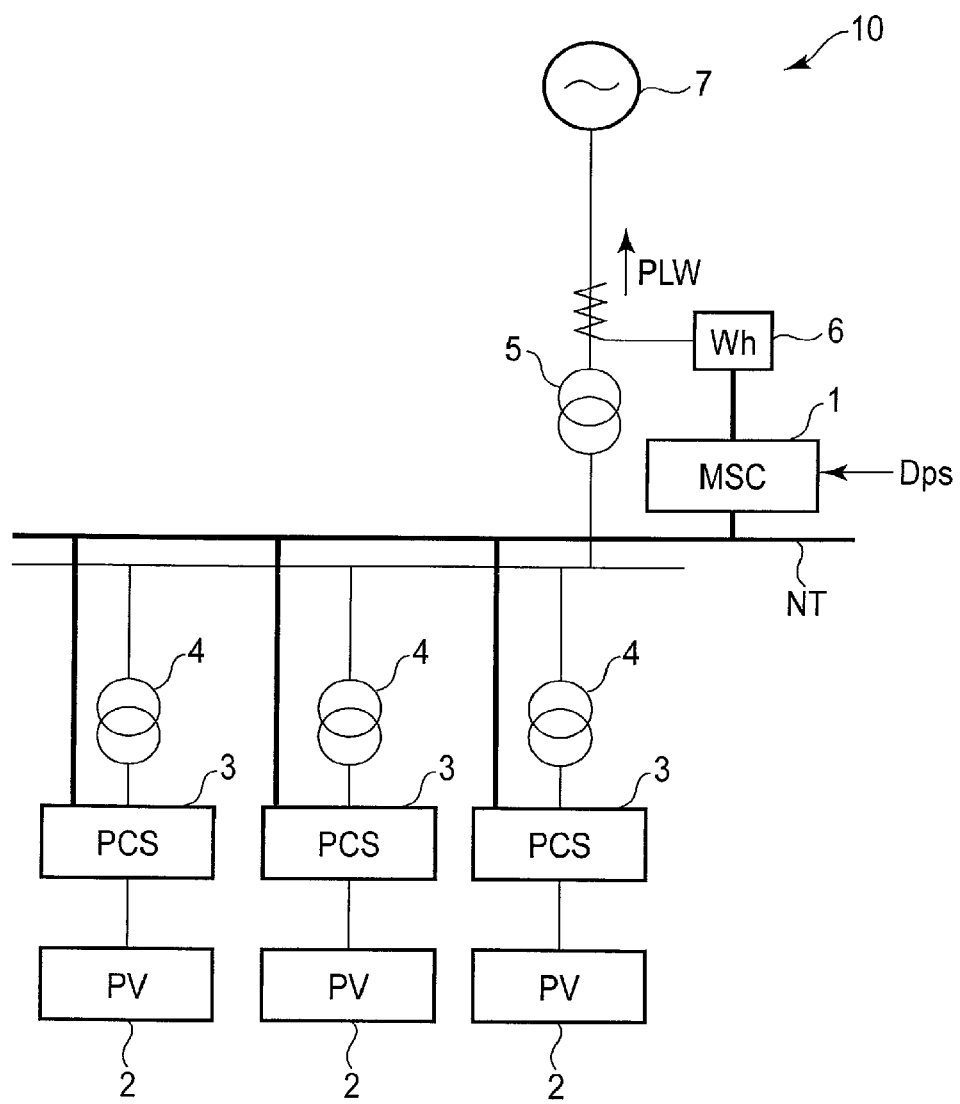
FIG. 1 is a block diagram showing the configuration of a PV system according to a first embodiment of the invention.

FIG. 1 is a block diagram showing the configuration of a PV system 70 according to a first embodiment of the invention. In the drawings, like elements are denoted by like reference numbers, and are not described in detail. Different elements will be mainly described.

The photovoltaic (PV) system 10 comprises a main site controller (MSC) 1, a plurality of PV modules 2, a plurality of power conditioners (PCSs) 3, a plurality of interconnection transformers 4, a main transformer 5, and a power meter 6. The PV system 10 interconnects with a power system 7.

The PV modules 2 are power generators, each including solar cells connected to each other. The solar cells generate electricity utilizing sunlight. The PV modules 2 output generated electricity (direct-current (DC) power) to the PCSs 3. The PV modules 2 have a power generation capacity greater than the rated capacity of the PCSs 3. For example, the PV modules 2 have, as a rated capacity, 120 to 130% of the rated capacity of the PCSs 3. The rated capacity of the PCSs 3 is not limited. It is sufficient if the rated capacity is predetermined. For example, the capacity may be determined based on hardware specifications, or may be a value obtained by dividing, by the number of the PCSs 3, the supply capacity (reverse power flow capacity) of the PV system 10 required by, for example, the administrator of the power system 7. Yet alternatively, the capacity may be determined by other methods.

The PCSs 3 are provided in the respective PV modules 2. The PCSs 3 are inverters for changing DC power supplied from the PV modules into AC power that is synchronized with the three-phase AC power system 7. The PCSs 3 output ac power to the main transformer 5 through the interconnection transformers 4. At a normal time, the PCSs 3 perform power conversion by maximum-power-point-tracking (MPPT) control for following a voltage (maximum power point voltage) at the maximum power point of the power output from the PV modules 2. When the PV modules 2 have generated electricity that exceeds the predetermined rated capacity of the PCSs 3, the PCSs 3 perform control for limiting their outputs to the rated capacity or less, without performing MPPT control.

The interconnection transformers 4 are provided in the respective PCSs 3. All interconnection transformers 4 are connected at their output side to the main transformer 5. The output side of the main transformer 5 is connected to the power system 7. The power output from the main transformer 5 serves as site output power (plant output power) PLW that is the output of the PV system 10.

The power meter 6 is a device for measuring the site output power PLW. The power meter 6 outputs the measured site output power PLW to an MSC 1.

The MSC 1 is a controller for controlling the whole PV system 10. The MSC 1 centrally monitors the PCSs 3 in the PV system 10 and controls the power generation of the PV system 10. The MSC 1 is interconnected to all PCSs 3 via a network NT for enabling data to be transmitted between all PCSs 3 and the MSC 1. The MSC 1 monitors and controls the PV system 10, based on the site output power PLW detected by the power meter 6, system data Dps received from the administrator of the power system 7, and data received from each PCS 3. The system data Dps is received from, for example, the system of a power company, or the energy management system (EMS) of a power distribution company that manages local power supply and demand.

FIG. 2 is a block diagram showing the configuration of the MSC 1 according to the embodiment.

The MSC 1 comprises a data acquisition unit 11, a PCS controller 12 and a PCS instruction unit 13.

The data acquisition unit 11 receives data required for control by MSC1. The data acquisition unit 11 receives the site output power PLW measured by the power meter 6, receives the system data Dps from the administrator of the power system 7, and receives, from the respective PCSs 3, necessary data, such as the generated power from the PV modules 2. The data acquisition unit 11 outputs data required for the PCS controller 12, based on the received data.

The PCS controller 12 performs computing for controlling each PCS 3 and performs computing for controlling the site output power PLW, based on the data received from the data acquisition unit 11. The power (power as a control target) handled by the PCSs controller 12 may be active power, reactive power, or power including both. The PCS controller 12 outputs data for controlling each PCS 3 to the PCS instruction unit 13, based on the result of control.

The PCS instruction unit 13 outputs an instruction to control the PCSs 3 to the respective PCSs 3, based on data received from the PCS controller 12.

Next, the PCS controller 12 will be described in detail.

Figure 3:
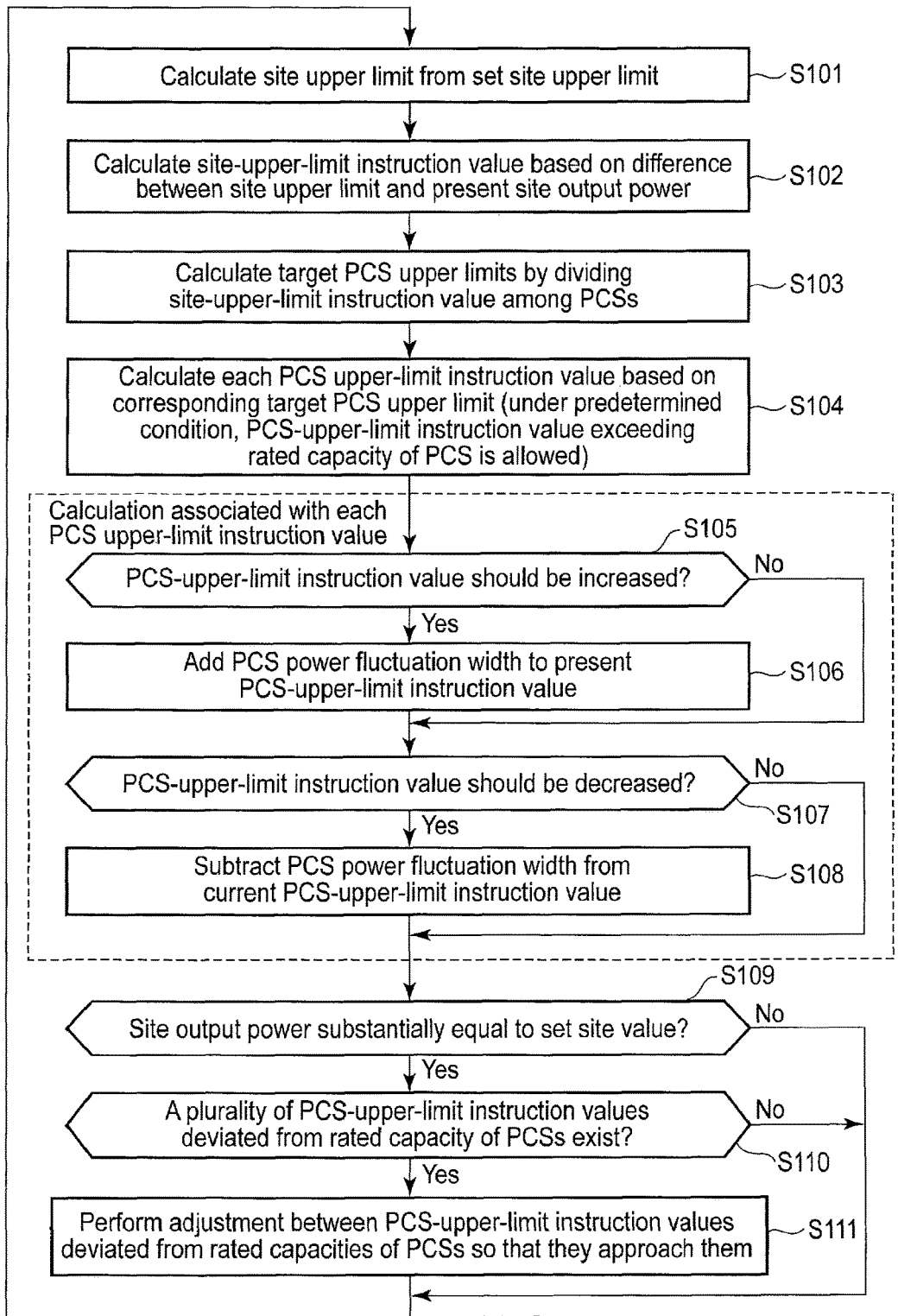
FIG. 3 is a flowchart showing the operation of a PCS controller according to the first embodiment.

FIG. 3 is a flowchart showing the operation of the PCS controller 12 according to the present embodiment.

The PCS controller 12 comprises a site-power limit controller 120 and a PCS-power limit controller 123.

The site-power limit controller 120 performs control for preventing the site output power PLW from exceeding a site upper limit and for preventing a fluctuation of the site output power PLW from exceeding an allowable fluctuation width (the greatest power fluctuation range permitted per unit time). The site upper limit and the allowable fluctuation width are specified by the administrator of the power system 7. The site upper limit is provided for limiting a reverse power flow to the power system 7 less than a predetermined value. The allowable fluctuation width is provided for limiting fluctuation in reverse power flow to the power system 7. The site upper limit and the allowable fluctuation width are included in, for example, the system data Dps received from the administrator of the power system 7.

The site-power limit controller 120 comprises a site-upper-limit calculation unit 121 and a site-upper-limit instruction value calculation unit 122.

The site-upper-limit calculation unit 121 calculates a site upper limit, based on a set site upper limit and an allowable fluctuation width (step S101 in FIG. 3). The site upper limit is an upper limit for the site output power PLW, which enables the site output power PLW to finally increase to a set site upper limit within a range in which fluctuation in the site output power PLW will not exceed the allowable fluctuation width. The site-upper-limit calculation unit 121 outputs the calculated site upper limit to the site-upper-limit instruction value calculation unit 122.

A description will now be given of a method of determining the site upper limit.

Figure 4:
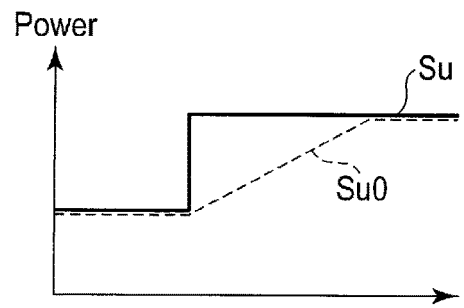
FIG. 4 is a graph showing first transition of a site upper limit according to the first embodiment.

FIG. 4 is a graph showing first transition of site upper limit Su0 in a case where set site upper limit Su is higher than site upper limit Su0. For example, this corresponds to a case where set site upper limit Su is changed to increase during operation of the PV system 10.

If site upper limit Su0 is rapidly (at once) changed to set site upper limit Su, fluctuation in the site output power PLW may exceed the above-mentioned allowable fluctuation width. In view of this, the site-upper-limit calculation unit 121 gradually changes (updates) site upper limit Su0 to set site upper limit Su so that site upper limit Su0 will not depart from the allowable fluctuation width. Site upper limit Su0 is changed regardless of present site output power PLW.

Figure 5:
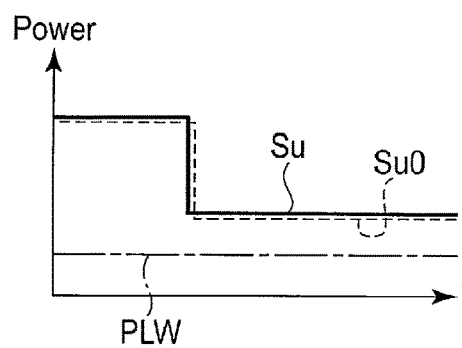
FIG. 5 is a graph showing second transition of the site upper limit according to the first embodiment.

FIG. 5 is a graph showing second transition of site upper limit Su0 in a case where set site upper limit Su is lower than site upper limit Su0, and the present site output power PLW is lower than site upper limit Su0. For instance, this corresponds to a case where the weather is bad and hence the PV system 10 does not fully demonstrate its inherent electricity generating capacity, whereby set site upper limit Su is changed to a lower value.

In this case, even if site upper limit Su0 is set to the same value as set site upper limit Su, the output of the site output power PLW is not limited by site upper limit Su0. Therefore, the site-upper-limit calculation unit 121 rapidly changes site upper limit Su0 to set site upper limit Su.

Figure 6:
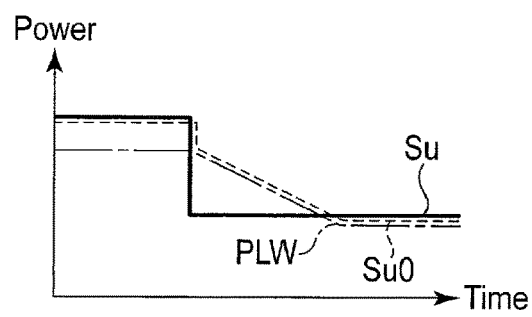
FIG. 6 is a graph showing third transition of the site upper limit according to the first embodiment.

FIG. 6 is a graph showing third transition of site upper limit Su0 in a case where set site upper limit Su is lower than site upper limit Su0, and the present site output power PLW is higher than set site upper limit Su. For instance, this corresponds to a case where the weather is good and hence the PV system 10 fully demonstrates its inherent electricity generating capacity, whereby set site upper limit Su is changed to a lower value.

In this case, if site upper limit Su0 is set to the same value as set site upper limit Su, the site output power PLW will be limited by site upper limit Su0. Accordingly, if site upper limit Su0 is rapidly changed to set site upper limit Su, the site output power PLW will rapidly fall to site upper limit Su0 (namely, set upper limit Su), and fluctuation in the site output power PLW may exceed the allowable fluctuation width. In view of this, in a first step, the site-upper-limit calculation unit 121 rapidly lowers site upper limit Su0 to the present site output power PLW. In a second step, the site-upper-limit calculation unit 121 gradually changes (updates) site upper limit Su0 to set site upper limit Su within the allowable fluctuation width.

The site-upper-limit instruction calculation unit 122 calculates a site-upper-limit instruction value, based on the difference between the site upper limit calculated by the site-upper-limit calculation unit 121 and the site output power PLW (step S102 in FIG. 3). The site-upper-limit instruction calculation unit 122 outputs the calculated site-upper-limit instruction value to the PCS-power limit controller 123.

A description will now be given of a method example of calculating the site-upper-limit instruction value.

The site-upper-limit instruction calculation unit 122 calculates the site-upper-limit instruction value, using the following equations:

$$\text{Site-upper-limit instruction value} = \text{present site output power } PLW + \text{correction difference} \quad (1)$$

$$\text{Correction difference} = Kp \times (\text{present difference} - \text{last difference} + fc \times \text{present difference}/Ti) \quad (2)$$

$$\text{Difference} = \text{site upper limit} - \text{present site output power } PLW \quad (3)$$

where $Kp$ is a proportional constant (gain), $fc$ is the control frequency of the MSC 1, and $Ti$ is an integration constant.

Although equation (2) is a calculation equation associated with proportional-plus-integral (PI) control, the site-upper-limit instruction value may be calculated, using a calculation equation associated with proportional-plus-integral-plus-derivative (PID) control, or using other control schemes.

The PCS-power limit controller 123 performs calculation processing for controlling each PCS 3, based on a site-upper-limit instruction value calculated by the site-upper-limit instruction calculation unit 122. The PCS-power limit controller 123 outputs data for controlling each PCS 3 to the PCS instruction unit 13, based on the result of control.

A description will then be given of calculation processing by the PCS-power limit controller 123.

The PCS-power limit controller 123 calculates a target PCS upper limit for each PCS 3 from the site-upper-limit instruction value, using an equation recited below (step S103 in FIG. 3). Respective target PCS upper limits are values obtained by dividing the site-upper-limit instruction value among PCSs (MSC-controllable PCSs) under management of the MSC 1 in accordance with the respective output capacities of the PCSs, and allocating the divided values to the respective PCSs. The MSC-controllable PCSs are PCSs that are under control of the MSC 1. Further, MSC-uncontrollable PCSs are PCSs that are out of control of the MSC 1.

$$\text{Each target PCS upper limit} = (\text{site-upper-limit instruction value} - \text{total output power of MSC-uncontrollable PCSs}) \times \text{maximum power of each PCS}/\text{total maximum power of PCSs} \quad (4)$$

where the maximum power of each PCS 3 is the maximum power that can be output regardless of the rated capacity of each PCS 3.

The PCS-power limit controller 123 calculates each PCS-upper-limit instruction value based on a corresponding each target PCS upper limit (step S104 in FIG. 3). Each PCS-upper-limit instruction value is an instruction value that directly limits the upper limit of the output power of a corresponding PCS 3. A method of determining the PCS-upper-limit instruction value will be described.

When the target PCS upper limit for a PCS 3 is less than the rated capacity of the PCS3, the PCS-power limit controller 123 determines the target PCS upper limit to be its PCS-upper-limit instruction value. When the target PCS upper limit exceeds the rated capacity of the PCS 3, the PCS-power limit controller 123 determines the target PCS upper limit to be the PCS-upper-limit instruction value, if a predetermined condition is satisfied. If the predetermined condition is not satisfied, the PCS-power limit controller 123 determines the rated capacity of the PCS 3 as the PCS-upper-limit instruction value. In this case, the PCS-power limit controller 123 adjusts the PCS-upper-limit instruction values by, for example, increasing other PCS-upper-limit instruction values, thereby preventing the site output power PLW from lowering.

For instance, the predetermined condition indicates a case where the other PCS-upper-limit instruction values do not include an upper-limit instruction value lower than the rated capacity of the PCS 3 and substantially identical to the output power of the PCS 3. The predetermined condition indicates that there is no PCS 3 whose output power is less than the rated capacity, and may be limited by the PCS-upper-limit instruction value. The predetermined condition may be a condition that suggests a state in which at least one PCS 3 can output only power less than the rated capacity, or may be any condition other than the same.

The PCS-power limit controller 123 updates the PCS-upper-limit instruction value as follows:

First, the PCS-power limit controller 123 calculates a PCS power conversion width per control time by an equation recited below. The PCS power conversion width per control time is a power width that can change the output power of each PCS 3 per control time.

PCS power conversion width per control time=site
power conversion width per control time/the
number of MSC-controlled PCSs   (5)

where the site power conversion width per control time is an power width that can change the site output power PLW per control time.

When the PCS-upper-limit instruction value is raised (YES in step S105 of FIG. 3), the PCS-power limit controller 123 adds the PCS power conversion width to the present PCS-upper-limit instruction value (step S106 of FIG. 3). When the PCS-upper-limit instruction value is reduced (YES in step S107 of FIG. 3), the PCS-power limit controller 123 subtracts the PCS power conversion width from the present PCS-upper-limit instruction value (step S108 in FIG. 3).

A description will be given of adjustment between the PCS-upper-limit instruction values by the PCS-power limit controller 123.

When the site output power PLW is substantially equal to the set site upper limit (YES in step S109 of FIG. 3), the PCS-power limit controller 123 performs adjustment between the PCS-upper-limit instruction values. A state where the site output power PLW is substantially equal to the set site upper limit indicates a state where the site output power PLW is output from the PV system 10, as is requested by the administrator of the power system 7.

Figure 7:
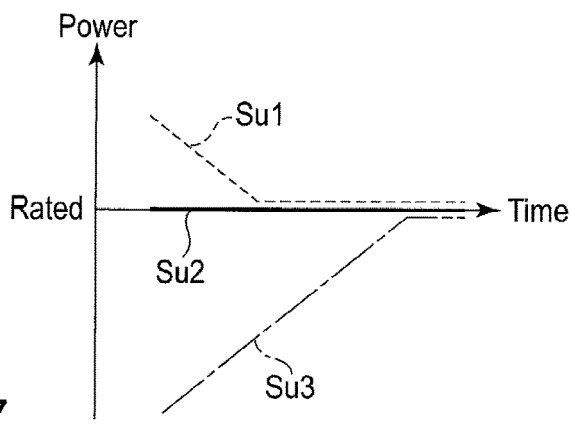
FIG. 7 is a graph showing transition of each PCS-upper-limit instruction value resulting from adjustment by a PCS power limit controller according to the first embodiment.

FIG. 7 is a graph showing transition of PCS-upper-limit instruction values Su1, Su2 and Su3 by the adjustment of the PCS-power limit controller 123. Assume here that the PCSs 3 have the same rated capacity. Assume also that in an initial state, PCS-upper-limit instruction value Su1 is much higher than the rated capacity, PCS-upper-limit instruction value Su2 is substantially the same as the rated capacity, and PCS-upper-limit instruction value Su3 is much lower than the rated capacity.

The PCS-power limit controller 123 determines whether there exist two or more PCS-upper-limit instruction values Su1 to Su3 that are deviated from the rated capacity of the PCSs 3 (step S110 in FIG. 3). This is because if two or more PCS-upper-limit instruction values Su1 to Su3 do not exist, adjustment cannot be performed. In FIG. 7, PCS-upper-limit instruction values Su1 and Su3 are adjustment targets.

The PCS-power limit controller 123 performs adjustment between PCS-upper-limit instruction values Su1 and Su3 so that they approach the respective rated capacities of the PCSs, with the site output power PLW held at substantially the same value as the set site upper limit (step S111 in FIG. 3). At this time, the width of change in each of PCS-upper-limit instruction values Su1 and Su3 corresponds to the PCS power conversion width per control time, calculated by above equation (5). That is, in FIG. 7, the lines associated with two PCS-upper-limit instruction values Su1 and Su3 gradually approaches the rated capacity, using the PCS power conversion width as their respective gradients. This prevents a particular PCS 3 from being excessively loaded.

Figure 8:
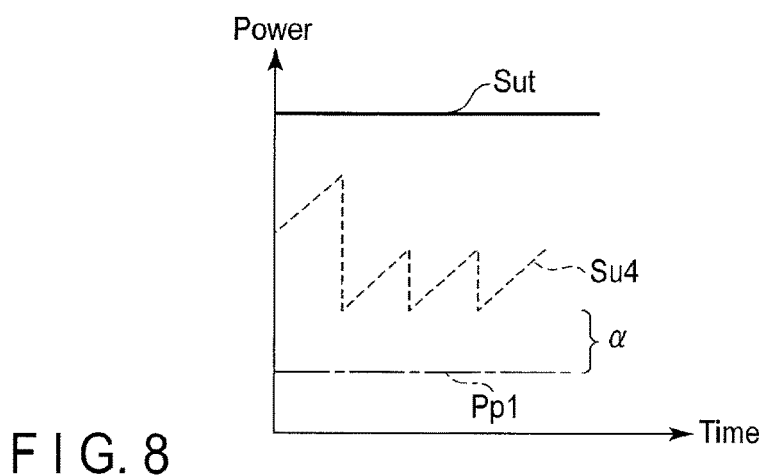
FIG. 8 is a graph showing a method of correcting the PCS-upper-limit instruction value by the PCS power limit controller according to the first embodiment.

In addition, the PCS-power limit controller 123 changes each PCS-upper-limit instruction value if needed. Referring then to FIG. 8, a method of correcting PCS-upper-limit instruction value Su4 using the PCS-power limit controller 123 will be described.

When the output power Pp1 of a PCS is much less than PCS-upper-limit instruction value Su4, the PCS-power limit controller 123 reduces PCS-upper-limit instruction value Su4 to a value obtained by adding preset power a to the present output power Pp1. If such a reduction is not set, the PCS-power limit controller 123 will increase PCS-upper-limit instruction value Su4 to follow PCS upper-limit target value Sut. This means that PCS-upper-limit instruction value Su4 is increased nevertheless no increases in the electricity generated by the PV module 2 are expected. Therefore, in this case, the PCS-power limit controller 123 performs adjustment to increase the other PCS-upper-limit instruction values as a result of decreasing PCS-upper-limit instruction value Su4, as described in step S111 of FIG. 3.

Figure 9:
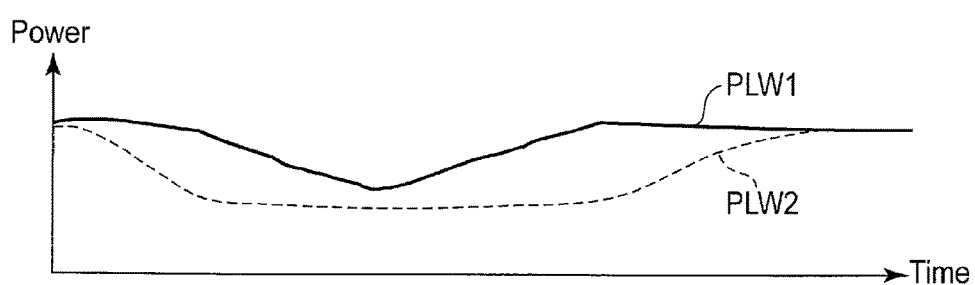
FIG. 9 is a graph showing the site output power of the PV system controlled by the MSC of the first embodiment.

FIG. 9 is a graph showing the site output power PLW of the PV system 10 controlled by the MSC 1 according to the embodiment. Site output power PLW1 is power controlled by the MSC 1. Site output power PLW2 is power not controlled by the MSC 1.

Although fluctuation in the output power of each PCS 3 varies because of, for example, the weather, both site output power levels PLW 2, each of which is the total of the power output from the PCSs 3, are relatively stable. Furthermore, under control of the MSC 1, site output power PLW2 exhibits a waveform wherein power is compensated for in low-power portions of site output power PLW2. That is, under the control of the MSC 1, the site output power PLW of the PV system 10 is further stabilized at a value close to the set site upper limit required by the administrator of the power system 7.

According to the first embodiment, in a normal state, all PCSs 3 perform outputs within the rated capacity. If the electricity generated by part of the PV modules 2 is reduced less than the rated capacity, other PV modules 2 with surplus energy generate electricity greater than the rated capacity of the PCSs. As a result, the site output power PLW of the PV system 10 can be supplied (as a reverse power flow) to the power system 7 stably, as the administrator of the power system 7 specifies.

Thus, even when some PV modules 2 are in the cloud cover or generate reduced electricity because of degradation, the PV system 10 can output electricity stably, with less influence from those factors.

Second Embodiment

Figure 10:
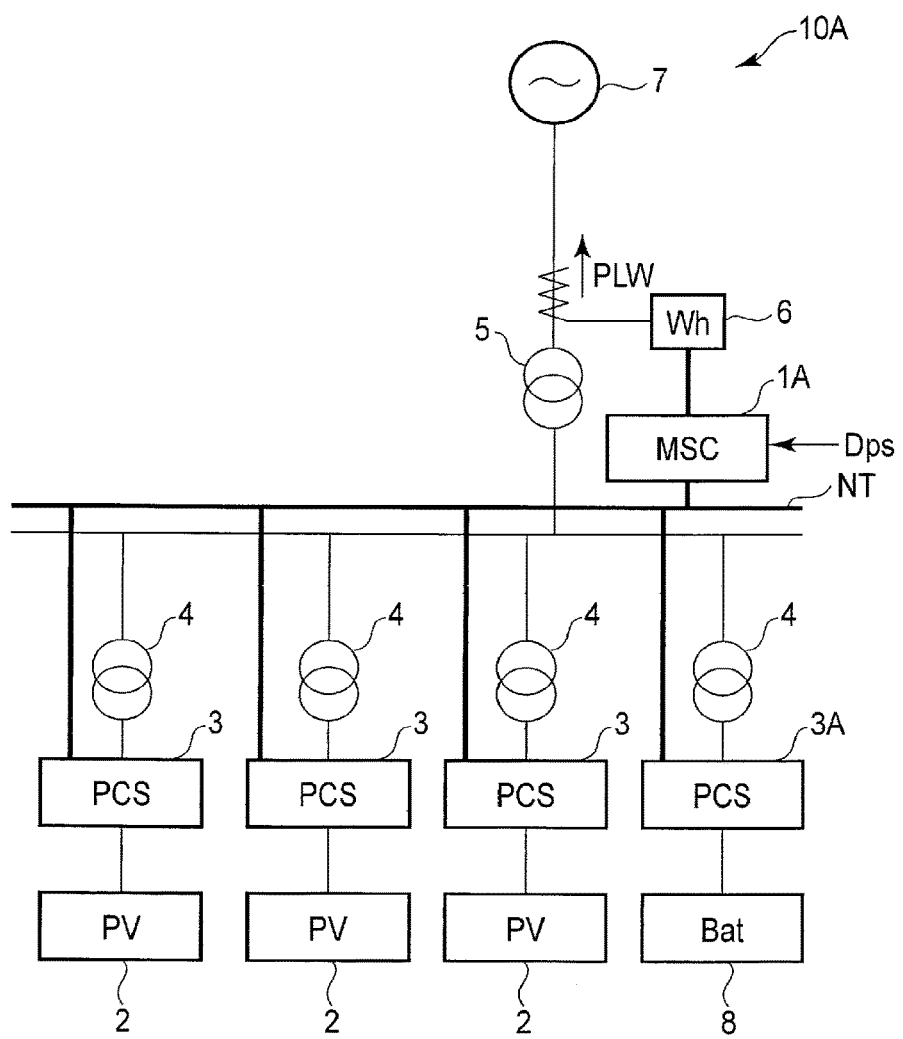
FIG. 10 is a view showing the configuration of a PV system according to a second embodiment of the invention.

FIG. 10 is a block diagram showing the configuration of a PV system 10A according to a second embodiment of the invention.

The PV system 10A is obtained by modifying the PV system 10 according to the first embodiment shown in FIG. 1 to add a rechargeable battery 8, PCS 3A and another interconnection transformer 4 and to replace the MSC 1 with an MSC 1A. The other points are the same as those of the PV system 10 according to the first embodiment.

In accordance with the operation of PCS 3A, the rechargeable battery 8 is charged with electricity output from other PCSs 3, and discharges the charged electricity as part of the site output power PLW of the PV system 10A. PCS 3A is connected to the main transformer 5 through a corresponding one of the interconnection transformers 4, like the other PCSs 3.

Figure 11:
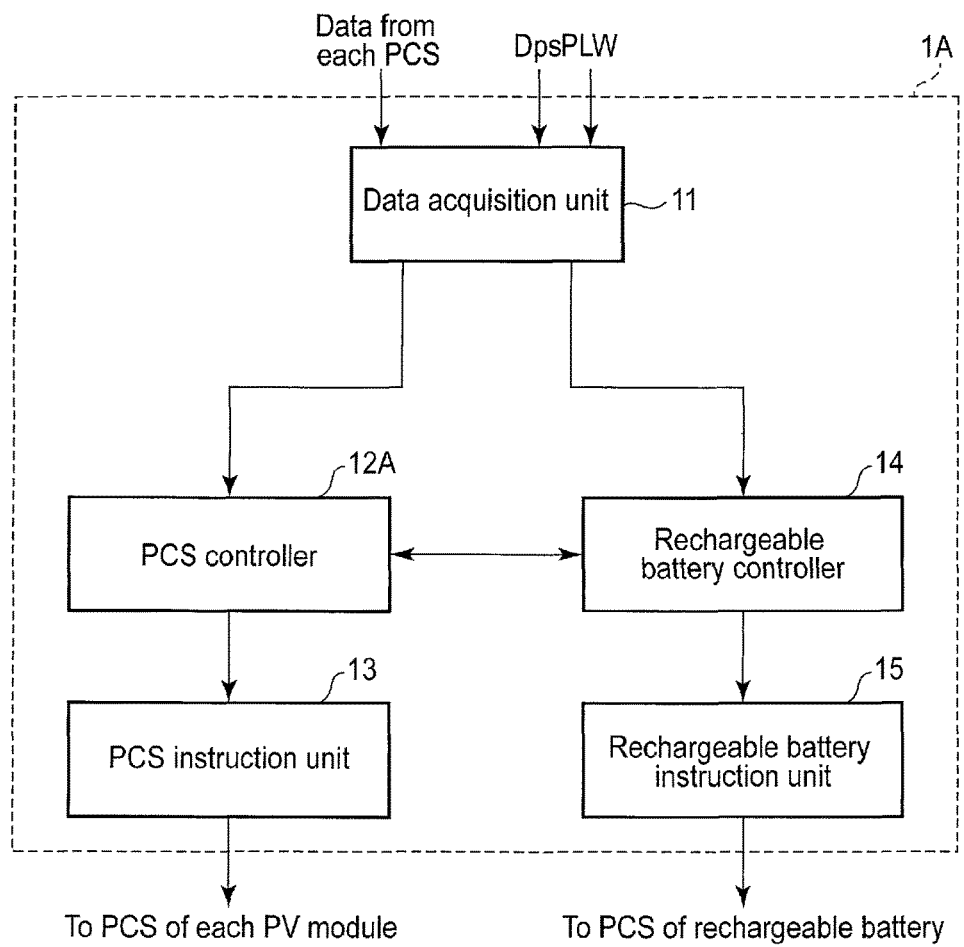
FIG. 11 is a block diagram showing the configuration of an MSC according to the second embodiment.

FIG. 11 is a block diagram showing the configuration of the MSC 1A according to the second embodiment.

The MSC 1A is obtained by modifying the MSC 1 according to the first embodiment shown in FIG. 2 to add a rechargeable battery controller 14 and a rechargeable battery instruction unit 15 and to replace the PCS controller 12 with a PCS controller 12A. The other points are the same as those of the MSC 1 of the first embodiment. The PCS controller 12A receives and transmits data from and to the rechargeable battery controller 14, thereby correcting the content of a command, to be sent to each PCS 3, in accordance with mutual control operations. The other points are the same as those of the PCS controller 12 of the first embodiment.

The rechargeable battery controller 14 performs computation for controlling the charge and discharge of the rechargeable battery 8, based on data received from the data acquisition unit 11. The rechargeable battery controller 14 outputs data for controlling PCS 3A to the rechargeable battery instruction unit 15, based on the result of computation.

The rechargeable battery instruction unit 15 outputs, to PCS 3A, an instruction for controlling the charge and discharge of the rechargeable battery 8, based on the data received from the rechargeable battery controller 14.

Figure 12:
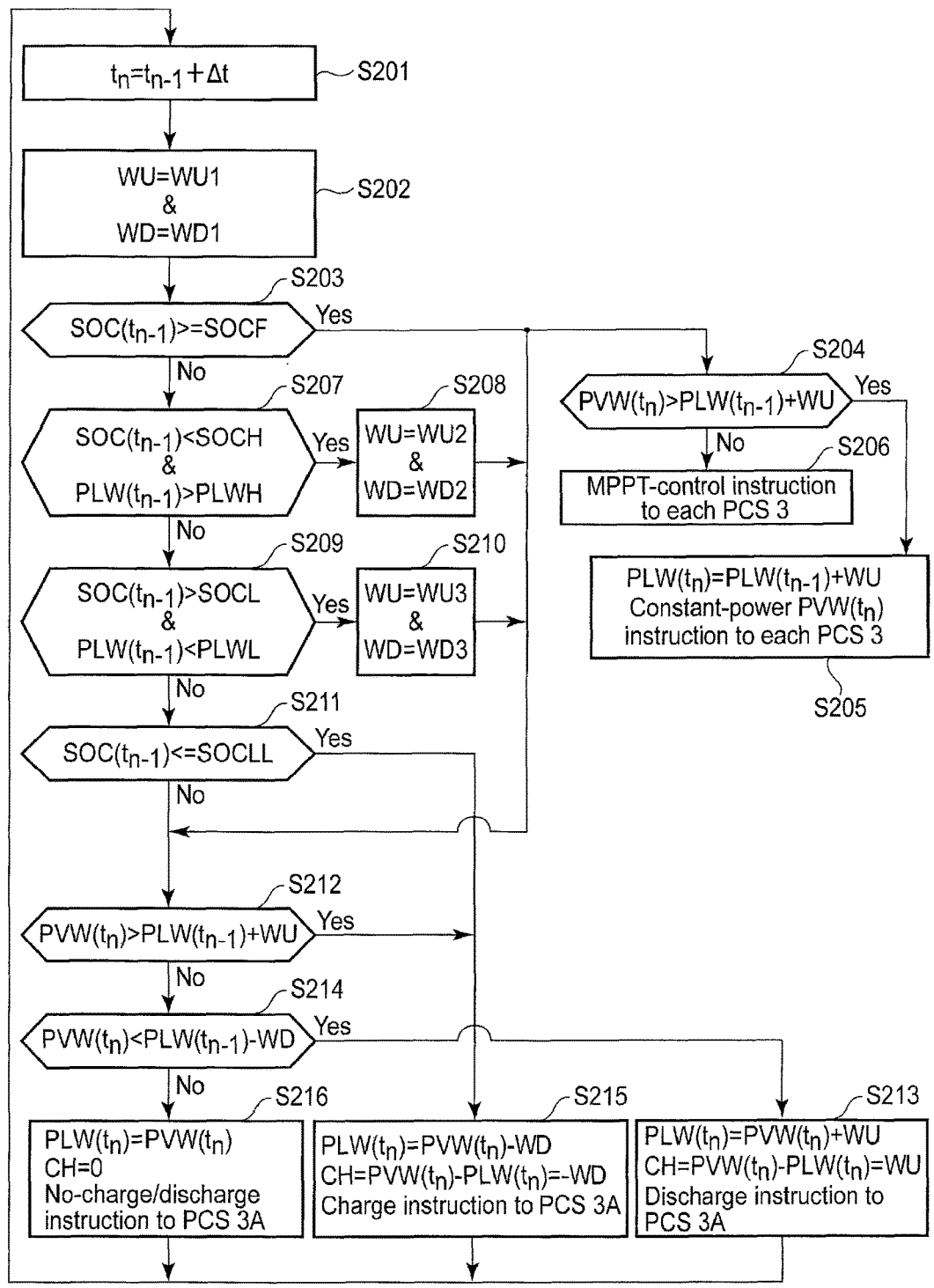
FIG. 12 is a flowchart showing the operation of a rechargeable-battery controller according to the second embodiment.

FIG. 12 is a flowchart showing the operation of the rechargeable battery controller 14 according to the present embodiment. Signs used in this flowchart will be described first.

tn: Present time; tn−1: Last time; Δt: Time difference between present time and last time; SOC: Charge of a rechargeable battery; SOCF: Full charge; SOCH: Target charge when PLW>PLWH; SOCL: Target discharge when PLW<PLWL; SOCLL: Set charge at which charging by forcedly reducing output power is to be started; PLWH: Set output power at which auxiliary charging is to be started; PLW: Site output power; PVW: PV-PCS output power; CH: Rechargeable battery charge-and-discharge power; WU: Set power increase rate (ΔW/Δt); WD: Set power decrease rate (ΔW/Δt); WU1: Allowable power decrease rate for Site output power; WD1: Allowable site-output-power decrease rate for Site output power; WU2: Set power increase rate for performing auxiliary charging when PLW>PLWH and SOC<SOCH; WD2: Set power decrease rate for performing auxiliary charge when PLW>PLWH and SOC<SOCH; WU3: Set power increase rate for performing auxiliary discharge when PLW<PLWL and SOC>SOCL; and WD3: Set power decrease rate for performing auxiliary discharge when PLW<PLWL and SOC>SOCL. Assume here that each sign represents a present value if (tn) is attached thereto as a suffix, and represents a last value if (t−n) is attached thereto as a suffix.

If the rechargeable battery 8 is in a full charge state (YES in step S203 in FIG. 12), it cannot be further charged. At this time, if the PV module 2 generates electricity more than the allowable one, the rechargeable battery 8 cannot absorb the extra electricity. Therefore, the rechargeable battery controller 14 outputs an instruction to perform a constant-power operation at a power level allowable in each PCS 3 (YES in step S204 of FIG. 12; step S205). At this time, the rechargeable battery controller 14 outputs, to each PCS 3, an instruction to perform MPPT control without exceeding the power allowable value (NO in step S204 of FIG. 12; step S206).

If the charge of the rechargeable battery 8 is small, the power generated by the PV module 2 is rapidly reduced, and the reduced state is continued, the rechargeable battery 8 may become empty before the site output power PLW is reduced to the power generated by the PV module 2 within an allowable decrease rate range. In view of this, when the charge of the rechargeable battery 8 is less than the set value SOCH and the site output power PLW exceeds the set value PLWH, the rechargeable battery controller 14 suppresses an increase in the site output power PLW, and charges the rechargeable battery 8 to the target value SOCH, using power corresponding to the suppressed power (YES in step S207 in FIG. 12; step S208).

If the charge of the rechargeable battery 8 is large, and the power generated by the PV module 2 is increased, full charge will soon be reached, which causes PCS 3 to shift from an MTTP control operation to a constant power operation to suppress the power generation of the PV module 2, whereby the possibility of power generation may be lost. To avoid this, the rechargeable battery controller 14 suppresses a decrease in the site output power PLW, and discharges the rechargeable battery 8 to the target value SOCL to compensate for the suppressed power, when the charge of the rechargeable battery 8 exceeds the set value SOCL and the site output power PLW is less than the set value PLWL (YES in step S209 of FIG. 12; step S210).

If the charge of the rechargeable battery is less than the set value SOCLL, the rechargeable battery controller 14 decreases the site output power PLW within the allowable decrease rate range, and charges the rechargeable battery 8 with electricity corresponding to the decreased output power (YES in step S211 of FIG. 12; step S215). Thus, the rechargeable battery controller 14 can deal with a case where the charge of the rechargeable battery 8 is small, and rapid charge is required.

The rechargeable battery controller 14 suppresses an increase in the site output power PLW, and charges the rechargeable battery 8 with electricity corresponding to the suppressed increase (YES in step S212 of FIG. 12; step S215). Thus, the rechargeable battery controller 14 can deal with a case where the power generation increase rate of the PV module 2 exceeds the set value WU.

The rechargeable battery controller 14 suppresses a decrease in the site output power PLW, and compensates for the suppressed decrease by discharging electricity corresponding thereto from the rechargeable battery 8 (YES in step S214 of FIG. 12; step S213). Thus, the rechargeable battery controller 14 can deal with a case where the power generation decrease rate of the PV module 2 is less than the set value WD.

If fluctuation in the power generated by the PV module 2 falls within both the allowable increase rate range and the allowable decrease rate range, the rechargeable battery controller 14 sets the power generated by all PV modules 2 to the site output power PLW, without charging or discharging the rechargeable battery 8 (NO in step S214 of FIG. 12; step S216).

In order to describe the effect of control by the rechargeable battery controller 14, a description will now be given of an effect obtained when the rechargeable battery 8 is controlled in a simple way.

Figure 13:
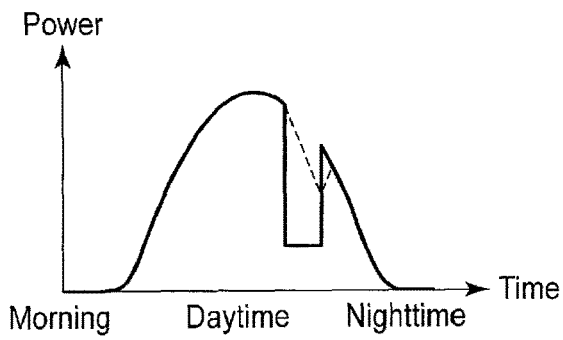
FIG. 13 is a graph showing one-day fluctuation in site output power due to simple control of a rechargeable battery, according to the second embodiment.
Figure 14:
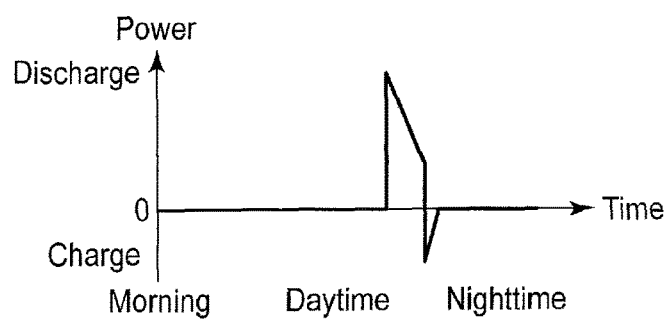
FIG. 14 is a graph showing fluctuation in the charge and discharge of the rechargeable battery due to simple control of the rechargeable battery, according to the second embodiment.
Figure 15:
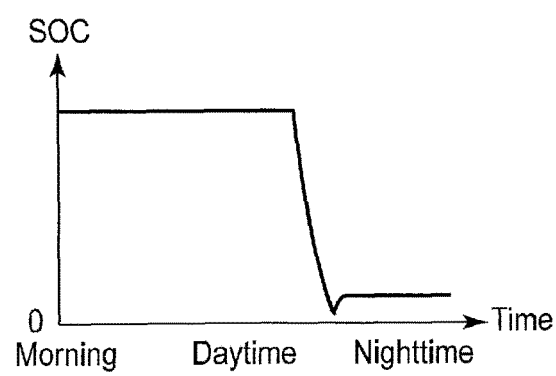
FIG. 15 is a graph showing fluctuation in the storage amount of the rechargeable battery due to simple control according to the second embodiment.

FIG. 13 is a graph showing one-day fluctuation in the site output power PLW due to simple control of the rechargeable battery 8. The broken line indicates a portion whose power is compensated for by the rechargeable battery 8. FIG. 14 is a graph showing fluctuation in the charge and discharge of the rechargeable battery 8 due to simple control. FIG. 15 is a graph showing fluctuation in the storage amount (SOC=state of charge) of the rechargeable battery due to simple control. FIGS. 13, 14 and 15 show states obtained at the same hour of the same day.

As shown in FIG. 13, on a clear day, the power generated by the PV system 10A exhibits a curve whose peak appears at the daytime of much insolation. In order to suppress, using the charge/discharge of the rechargeable battery 8, an abrupt change in generated electricity due to a change in insolation caused by, for example, cloud cover, the rechargeable battery 8 is discharged when the generated electricity is reduced, and is charged when the generated electricity is increased, as is shown in FIG. 14. As a result, in a greater part of a day, the rechargeable battery 8 assumes either a substantially fully charged state or a substantially uncharged state, as is shown in FIG. 15.

However, if the rechargeable battery 8 is kept in the full charge state, it cannot be charged when the site output power PLW increases, whereby an increase in the site output power PLW cannot be suppressed using the charge operation of the rechargeable battery 8. In contrast, if the rechargeable battery 8 is kept in the substantially uncharged state, it cannot be discharged when the site output power PLW decreases, whereby a decrease in the site output power PLW cannot be suppressed using the discharge operation of the rechargeable battery 8. If the capacity of the rechargeable battery 8 is increased, those problems may be overcome. However, the increase of the capacity of the rechargeable battery 8 will inevitably involve an increase in the cost of the entire PV system 10A.

An effect of control by the rechargeable battery controller 14 will be described.

FIG. 16 is a graph showing one-day fluctuation in the site output power PLW because of control of the rechargeable battery 8 by the rechargeable-battery controller 14. The broken line indicates a portion whose power is compensated for by the rechargeable battery 8. The one-dot chain line indicates a portion where peak cut is performed by the rechargeable battery 8.

FIG. 17 is a graph showing fluctuation in the charge and discharge of the rechargeable battery 8 by the control of the rechargeable-battery controller 14. FIG. 18 is a graph showing fluctuation in the charge of the rechargeable battery 8 by the control of the rechargeable-battery controller 14. FIGS. 16, 17 and 18 show states obtained at the same hour of the same day.

As shown in FIGS. 16 and 17, charge of the rechargeable battery 8 is started after the site output power PLW exceeds a set value. The peak of the site output power PLW is suppressed by the charge. Even if an abrupt decrease occurs in generated electricity because of, for example, cloud cover, the width of fluctuation in the decrease of the site output power PLW becomes small since the peak value of the same is low. Accordingly, the capacity of the rechargeable battery 8 needed for suppressing the fluctuation is small.

FIG. 19 is a graph showing another-day (different from the day associated with FIGS. 16 to 18) fluctuation in the site output power PLW because of the control of the rechargeable battery 8 by the rechargeable-battery controller 14. The broken line indicates a portion where peak cut is performed by the rechargeable battery 8. The one-dot chain line indicates a portion where electricity fluctuation is suppressed by switching each PCS 3 from MPPT control to constant-power control.

If the rechargeable battery 8 is fully charged, and cannot suppress increase of the site output power PLW by its further charging, the rechargeable battery controller 14 switches each PCS 3 from MPPT control to constant-power control. The rechargeable battery controller 14 can suppress abrupt fluctuation in electricity by imparting, at every moment, a set-power instruction value to each PCS 3 even when the rechargeable battery 8 is in the fully charged state.

According to the present embodiment, fluctuation in the site output power PLW can be further suppressed by providing the rechargeable battery 8 and performing charge/discharge control of the rechargeable battery 8, in addition to the function of the first embodiment.

Moreover, the capacity of the rechargeable battery 8 can be effectively used by controlling, using the rechargeable battery controller 14, the charge and discharge of the rechargeable battery 8 to suppress fluctuation in the site output power PLW. This structure enables the required capacity of the rechargeable battery 8 installed in the PV system 10A to be reduced compared to a case where the rechargeable battery 8 is controlled in a simple way.

It is to be noted that the present invention is not restricted to the foregoing embodiments, and constituent elements can be modified and changed into shapes without departing from the scope of the invention at an embodying stage. Additionally, various inventions can be formed by appropriately combining a plurality of constituent elements disclosed in the foregoing embodiments. For example, several constituent elements may be eliminated from all constituent elements disclosed in the embodiments. Furthermore, constituent elements in the different embodiments may be appropriately combined.

What is claimed is:

1. A photovoltaic system comprising:
power generators configured to generate power utilizing sunlight;
inverters configured to convert the power generated by the power generators into alternating-current power output to a power system;
a total output power detector configured to detect a total amount of power outputted from the inverters;
an upper-limit calculator configured to calculate an upper-limit to change a set upper limit, the set upper limit limiting the total amount of the power, the upper-limit being calculated to change the set upper limit so that a fluctuation of the total amount of the power does not exceed a predetermined fluctuation width;
an upper-limit instruction value calculator configured to calculate an upper-limit instruction value based on the total amount of the power detected by the total output power detector and the upper-limit calculated by the upper-limit calculator;
an inverter upper-limit instruction value calculator configured to calculate an inverter upper-limit instruction value limiting output power of each of the inverters, the inverter upper-limit instruction value being calculated based on the upper-limit instruction value calculated by the upper-limit instruction value calculator;
a first limiter configured to limit the inverter upper-limit instruction value calculated by the inverter upper-limit instruction value calculator not more than a predetermined capacity, and to limit output power of the inverters not more than the inverter upper-limit instruction value;
a second limiter configured to limit, in a condition in which the inverter upper-limit instruction value with respect to at least one of the inverters is changed so that output power of the at least one of the inverters becomes a level exceeding the predetermined capacity, the output power of the inverters not more than the inverter upper-limit instruction value, when a predetermined condition is satisfied; and
an inverter controller configured to control the output power of the inverters, based on the first limiter or the second limiter.

2. The photovoltaic system of claim 1, wherein the second limiter sets as the predetermined condition that the output power of the at least one of the inverters is less than the predetermined capacity.

3. The photovoltaic system of claim 1, wherein the inverter controller controls fluctuation in alternating-current power, output to the power system, within a predetermined fluctuation range.

4. The photovoltaic system of claim 1, further comprising:
   a rechargeable battery; and
   a rechargeable battery controller configured to control charge and discharge of the rechargeable battery to suppress fluctuation in alternating-current power output to the power system.

5. The photovoltaic system of claim 4, wherein the rechargeable battery controller starts to charge the rechargeable battery when the alternating-current power output to the power system exceeds first predetermined power.

6. The photovoltaic system of claim 4, wherein the rechargeable battery controller starts to discharge the rechargeable battery when the alternating-current power output to the power system is less than second predetermined power.

7. A controller for a photovoltaic system that controls inverters which convert power generated by power generators using sunlight into alternating-current power output to a power system, the controller comprising:
   a total output power detector configured to detect a total amount of power outputted from the inverters;
   an upper-limit calculator configured to calculate an upper-limit to change a set upper limit, the set upper limit limiting the total amount of the power, the upper-limit being calculated to change the set upper limit so that a fluctuation of the total amount of the power does not exceed a predetermined fluctuation width;
   an upper-limit instruction value calculator configured to calculate an upper-limit instruction value based on the total amount of the power detected by the total output power detector and the upper-limit calculated by the upper-limit calculator;
   an inverter upper-limit instruction value calculator configured to calculate an inverter upper-limit instruction value limiting output power of each of the inverters, the inverter upper-limit instruction value being calculated based on the upper-limit instruction value calculated by the upper-limit instruction value calculator;
   a first limiter configured to limit the inverter upper-limit instruction value calculated by the inverter upper-limit instruction value calculator not more than a predetermined capacity, and to limit output power of the inverters not more than the inverter upper-limit instruction value;
   a second limiter configured to limit, in a condition in which the inverter upper-limit instruction value with respect to at least one of the inverters is chanced so that output power of the at least one of the inverters becomes a level exceeding the predetermined capacity, the output power of the inverters not more than the inverter upper-limit instruction value, when a predetermined condition is satisfied; and
   an inverter controller configured to control the output power of the inverters, based on the first limiter or the second limiter.

8. The controller of claim 7, wherein the second limiter sets as the predetermined condition that the output power of the at least one of the inverters is less than the predetermined capacity.

9. The controller of claim 7, wherein the inverter controller controls fluctuation in alternating-current power, output to the power system, within a predetermined fluctuation range.

10. The controller of claim 7, wherein the photovoltaic system includes a rechargeable battery, the controller further comprising,
    a rechargeable battery controller configured to control charge and discharge of the rechargeable battery to suppress fluctuation in alternating-current power output to the power system.

11. The controller of claim 10, wherein the rechargeable battery controller starts to charge the rechargeable battery when the alternating-current power output to the power system exceeds first predetermined power.

12. The controller of claim 10, wherein the rechargeable battery controller starts to discharge the rechargeable battery when the alternating-current power output to the power system is less than second predetermined power.

13. A method, for use in a photovoltaic system, of controlling inverters which convert power generated by power generators using sunlight into alternating-current power output to a power system, the method comprising:
    detecting, by a total output power detector, a total amount of power outputted from the inverters;
    calculating, by an upper-limit calculator, an upper-limit to change a set upper limit, the set upper limit limiting the total amount of the power, the upper-limit being calculated to change the set upper limit so that a fluctuation of the total amount of the power does not exceed a predetermined fluctuation width;
    calculating, by an upper-limit instruction value calculator, an upper-limit instruction value based on the total amount of the power detected by the total output power detector and the upper-limit calculated by the upper-limit calculator;
    calculating, by an inverter upper-limit instruction value calculator, an inverter upper-limit instruction value limiting output power of each of the inverters, the inverter upper-limit instruction value being calculated based on the upper-limit instruction value calculated by the upper-limit instruction value calculator;
    performing a first limit operation of limiting the inverter upper-limit instruction value calculated by the inverter upper-limit instruction value calculator not more than a predetermined capacity, and of limiting output power of the inverters not more than the inverter upper-limit instruction value;
    performing a second limit operation of limiting, in a condition in which the inverter upper-limit instruction value with respect to at least one of the inverters is changed so that output power of the at least one of the inverters becomes a level exceeding the predetermined capacity, the output power of the inverters not more than the inverter upper-limit instruction value, when a predetermined condition is satisfied; and
    controlling the output power of the inverters, based on the first limit operation or the second limit operation.

* * * * *